(12) United States Patent
Gu et al.

(10) Patent No.: US 11,536,876 B2
(45) Date of Patent: Dec. 27, 2022

(54) COMPOSITE MEMBRANE, TOUCHPAD AND DISPLAY DEVICE

(71) Applicant: Shanghai Tianma Micro-Electronics Co., Ltd., Shanghai (CN)

(72) Inventors: Yuefeng Gu, Shanghai (CN); Jun Zhou, Shanghai (CN); Ruifen Fu, Shanghai (CN); Jiandong Wang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 172 days.

(21) Appl. No.: 16/917,112

(22) Filed: Jun. 30, 2020

(65) Prior Publication Data
US 2021/0349241 A1 Nov. 11, 2021

(30) Foreign Application Priority Data
May 9, 2020 (CN) .......................... 202010386833.1

(51) Int. Cl.
*G02B 1/115* (2015.01)
*G06F 3/044* (2006.01)
(Continued)

(52) U.S. Cl.
CPC .......... *G02B 1/115* (2013.01); *G02F 1/13338* (2013.01); *G02F 1/133502* (2013.01);
(Continued)

(58) Field of Classification Search
CPC ........... G02F 1/13338; G02F 1/133502; G06F 3/0412
See application file for complete search history.

(56) References Cited

U.S. PATENT DOCUMENTS

| 3,706,485 A | * | 12/1972 | Fawcett | .............. | C03C 17/3417 |
| | | | | | 359/588 |
| 2005/0083307 A1 | * | 4/2005 | Aufderheide | ......... | G06F 3/0443 |
| | | | | | 345/173 |

(Continued)

FOREIGN PATENT DOCUMENTS

| CN | 109300942 A | 2/2019 |
| CN | 110205594 A | 9/2019 |
| CN | 110391304 A | 10/2019 |

*Primary Examiner* — Jessica M Merlin
(74) *Attorney, Agent, or Firm* — von Briesen & Roper, s.c.

(57) ABSTRACT

Provided are a composite membrane, a touchpad and a display device. The composite membrane includes a first graded-refractive-index layer, a first dielectric layer and a second graded-refractive-index layer which are stacked in sequence; where the first graded-refractive-index layer includes at least two first sub-layers, and the second graded-refractive-index layer includes at least two second sub-layers; in a direction from the first graded-refractive-index layer to the first dielectric layer, refractive indexes of first sub-layers sequentially increase, and refractive indexes of second sub-layers sequentially decrease; a refractive index of a first sub-layer adjacent to the first dielectric layer is less than or equal to a refractive index of the first dielectric layer; and a refractive index of a second sub-layer adjacent to the first dielectric layer is less than or equal to the refractive index of the first dielectric layer.

20 Claims, 14 Drawing Sheets

(51) Int. Cl.
*G02F 1/1333* (2006.01)
*G02F 1/1335* (2006.01)
*H01L 27/32* (2006.01)
*H01L 51/52* (2006.01)
*G06F 3/041* (2006.01)

(52) U.S. Cl.
CPC .......... *G06F 3/0412* (2013.01); *G06F 3/0443* (2019.05); *G06F 3/0446* (2019.05); *H01L 27/323* (2013.01); *H01L 51/5281* (2013.01)

(56) References Cited

U.S. PATENT DOCUMENTS

| | | | | |
|---|---|---|---|---|
| 2013/0105294 A1* | 5/2013 | Ye | .......................... | C09K 19/02 |
| | | | | 200/600 |
| 2015/0077646 A1* | 3/2015 | Chen | ..................... | G06F 3/0418 |
| | | | | 349/12 |
| 2017/0083123 A1* | 3/2017 | Hsieh | ................... | G02B 6/0011 |

* cited by examiner

--Prior Art--

COMPOSITE MEMBRANE, TOUCHPAD AND DISPLAY DEVICE

CROSS-REFERENCE TO RELATED APPLICATIONS

The present disclosure claims priority to Chinese patent application No. CN202010386833.1, entitled "Composite Membrane, Touchpad And Display Device" and filed on May 9, 2020, the content of which is incorporated herein by reference in its entirety.

TECHNICAL FIELD

The present disclosure relates to display technologies, and in particular, to a composite membrane, a touchpad and a display device.

BACKGROUND

With the rapid development of display technologies, various portable electronic devices (such as a mobile phone, a tablet and the like) with display panels are gradually becoming essential portable items in people's lives and work.

In order to improve the display quality for an existing display panel, an antireflection structure which can reduce a light reflectivity is disposed on a light emitting surface side of the display panel. An existing antireflection structure usually includes a periodic structure in which multiple layers of high refractive index materials and low refractive index materials are alternately stacked. A destructive interference principle is used to achieve the objects of reducing reflected light and enhancing transmitted light. Since chambers of different materials or even different film forming machines are required to be switched back and forth in a process of preparing alternately stacked high refractive index materials and low refractive index materials, the preparation cost is relatively high.

SUMMARY

The present disclosure provides a composite membrane, a touchpad and a display device. The composite membrane is provided with a first graded-refractive-index layer and a second graded-refractive-index layer to weaken a medium interface, such that an effect of antireflection is achieved. In addition, both the first graded-refractive-index layer and the second graded-refractive-index layer are a unitary layer material which can be formed by a one-step process, which is conducive to reducing the process difficulty and the preparation cost.

An embodiment of the present disclosure provides a composite membrane. The composite membrane includes a first graded-refractive-index layer, a first dielectric layer and a second graded-refractive-index layer which are stacked in sequence.

The first graded-refractive-index layer includes at least two first sub-layers, and the second graded-refractive-index layer includes at least two second sub-layers.

In a direction from the first graded-refractive-index layer to the first dielectric layer, refractive indexes of first sub-layers in the first graded-refractive-index layer sequentially increase, and refractive indexes of second sub-layers in the second graded-refractive-index layer sequentially decrease.

A refractive index of a first sub-layer adjacent to the first dielectric layer is less than or equal to a refractive index of the first dielectric layer.

A refractive index of a second sub-layer adjacent to the first dielectric layer is less than or equal to the refractive index of the first dielectric layer.

An embodiment of the present disclosure further provides a touchpad. The touchpad includes the above-mentioned composite membrane.

The first dielectric layer includes at least one transparent conductive layer, and the first dielectric layer constitutes a touch electrode layer.

An embodiment of the present disclosure further provides a display device. The display device includes a display module and the composite membrane disposed on a light emitting surface side of the display module and/or the touchpad disposed on the light emitting surface side of the display module.

The composite membrane provided by the embodiment of the present disclosure includes the first graded-refractive-index layer, the first dielectric layer and the second graded-refractive-index layer which are stacked in sequence. The first graded-refractive-index layer includes the at least two first sub-layers, and the second graded-refractive-index layer includes the at least two second sub-layers. In the direction from the first graded-refractive-index layer to the first dielectric layer, the refractive indexes of the first sub-layers in the first graded-refractive-index layer sequentially increase, and the refractive indexes of the second sub-layers in the second graded-refractive-index layer sequentially decrease. The refractive index of the first sub-layer adjacent to the first dielectric layer is less than or equal to the refractive index of the first dielectric layer. The refractive index of the second sub-layer adjacent to the first dielectric layer is less than or equal to the refractive index of the first dielectric layer. The refractive index of the first dielectric layer is greater than or equal to refractive indexes of the first graded-refractive-index layer and the second graded-refractive-index layer, such that a film structure with variable refractive indexes is formed. Both the first graded-refractive-index layer and the second graded-refractive-index layer include at least two sub-layers, such that an interface between media is weakened. The reduction of reflected light and improvement of transmitted light are achieved by synthesizing a film interference principle and a refractive index gradient principle. In a preparation process, both the first graded-refractive-index layer and the second graded-refractive-index layer are a unitary layer material which can be formed by a one-step process, which is conducive to reducing the process difficulty and the preparation cost. A relationship between the refractive index and the thickness of each sub-layer in the graded-refractive-index layer is comprehensively adjusted, such that a hue adjustment is achieved, and the composite membrane satisfies requirements of low reflectivity and hue.

DETAILED DESCRIPTION

Figure 1:
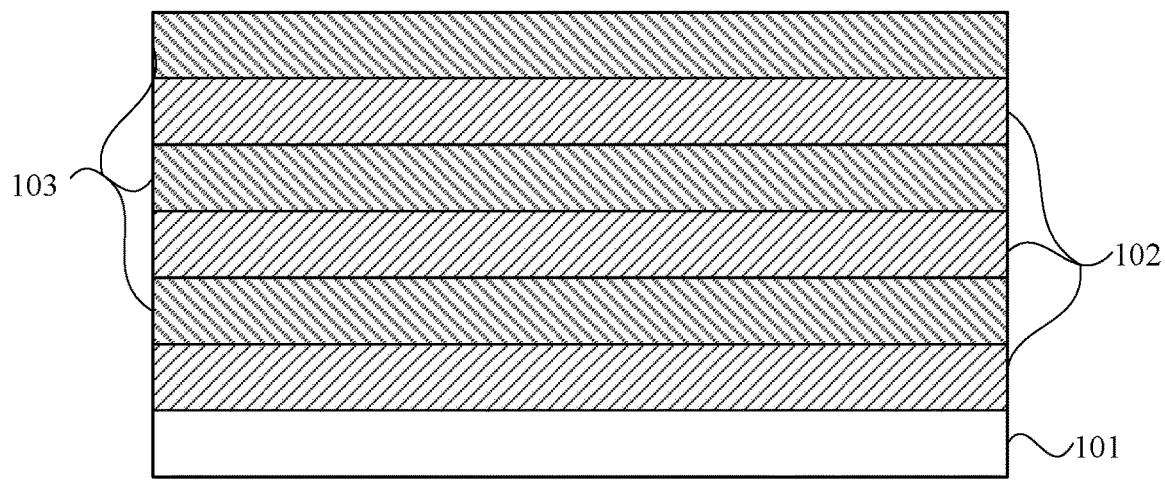
FIG. 1 is a structural diagram of a low-reflectivity cover plate in the related art.

The present disclosure will be further described hereinafter in detail in conjunction with the drawings and embodiments. It is to be understood that the embodiments described herein are merely intended to illustrate and not to limit the present disclosure. Additionally, it is to be noted that for ease of description, merely part, not all, of the structures related to the present disclosure are illustrated in the drawings.

Terms used in the embodiments of the present disclosure are merely used for describing the embodiments and are not intended to limit the present disclosure. It is to be noted that prepositions of locality, such as "on", "below", "left" and "right", used in the embodiments of the present disclosure are described from the perspective of the drawings, and are not to be construed as a limitation to the embodiments of the present disclosure. Additionally, according to the context, it is to be understood that when an element is formed "on" or "below" another element, the element may be directly formed "on" or "below" another element, or may be indirectly formed "on" or "below" another element via an intermediate element. The terms "first", "second" and the like are only used for description. The terms "first", "second" and the like do not represent any order, quantity, or importance, but rather are used for distinguishing different components. For those of ordinary skill in the art, the meanings of the preceding terms in the present disclosure can be construed according to specific circumstances.

In the related art, a cover plate with a low reflectivity is disposed on a light emitting side of a display panel, which is conducive to improving the display quality of the display panel and reducing the influence of external ambient light on the display. Exemplarily, FIG. 1 is a structural diagram of a low-reflectivity cover plate in the related art. Referring to FIG. 1, an existing low-reflectivity cover plate includes a glass substrate 101, and high-refractive-index layers 102 and low-refractive-index layers 103, which are alternately stacked on the glass substrate 101. The high-refractive-index layer 102 may generally be titanium dioxide ($TiO_2$), niobium pentoxide ($Nb_2O_5$), silicon nitride ($SiN_x$) and the like, and the low-refractive-index layer 103 may generally be silicon dioxide ($SiO_2$). Such a structure in which the high-refractive-index layers and the low-refractive-index layers are alternately stacked requires chambers of different materials or even different film forming machines to be switched back and forth during preparation, so the process is complex and the cost is relatively high. In one aspect, the existing low-reflectivity cover plate has a high reflectivity, and in another aspect, since the cover plate is formed by stacking high/low/high/low refractive index films and the refractive index of each film is fixed, a hue of the cover plate may not be adjusted and the requirement of high-quality display may not be satisfied.

In view of this, an embodiment of the present disclosure provides a composite membrane having a function of antireflection, and the composite membrane can be used in the cover plate located on the light emitting side of the display panel, which is conducive to reducing the process difficulty and the cost. In other embodiments, the composite membrane may also be applied to other devices which require an antireflection structure, such as applications in the solar cell field. This embodiment is merely used for describing applications in the display field. The composite membrane provided by the embodiment of the present disclosure includes a first graded-refractive-index layer, a first dielectric layer and a second graded-refractive-index layer which are stacked in sequence. The first graded-refractive-index layer includes at least two first sub-layers, and the second graded-refractive-index layer includes at least two second sub-layers. In a direction from the first graded-refractive-index layer to the first dielectric layer, refractive indexes of first sub-layers in the first graded-refractive-index layer sequentially increase, and refractive indexes of second sub-layers in the second graded-refractive-index layer sequentially decrease. The refractive index of a first sub-layer adjacent to the first dielectric layer is less than or equal to the refractive index of the first dielectric layer, and the refractive index of a second sub-layer adjacent to the first dielectric layer is less than or equal to the refractive index of the first dielectric layer.

Figure 2:
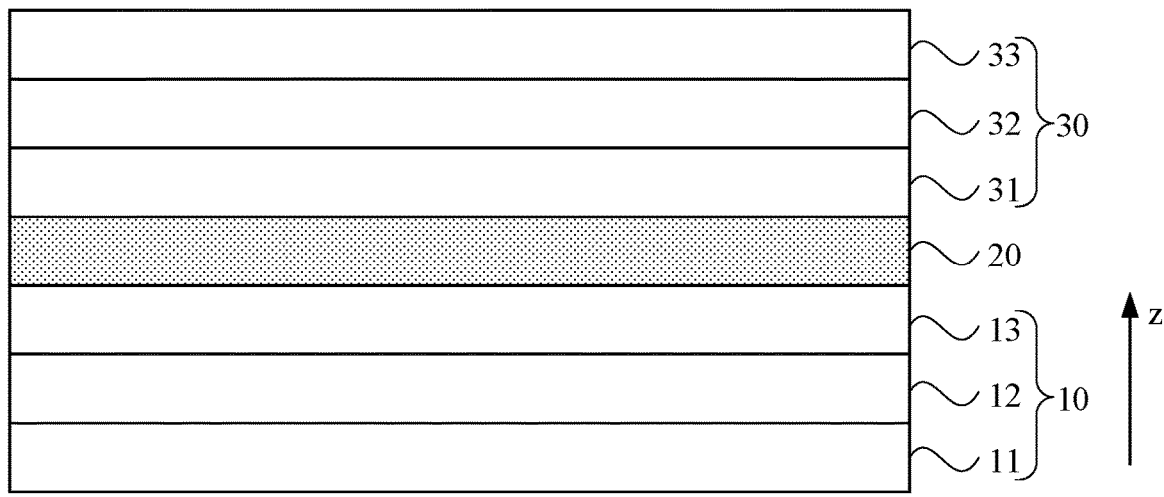
FIG. 2 is a structural diagram of a composite membrane according to an embodiment of the present disclosure.

Exemplarily, FIG. 2 is a structural diagram of a composite membrane according to an embodiment of the present disclosure. Referring to FIG. 2, the composite membrane provided by this embodiment includes a first graded-refractive-index layer 10, a first dielectric layer 20 and a second graded-refractive-index layer 30, which are stacked in sequence. The first graded-refractive-index layer 10 includes three first sub-layers 11, 12 and 13, and the second graded-refractive-index layer 30 includes three second sub-layers 31, 32 and 33. In a direction z from the first graded-refractive-index layer 10 to the first dielectric layer 20, the refractive indexes of the first sub-layers 11, 12 and 13 sequentially increase, and the refractive indexes of the second sub-layers 31, 32 and 33 sequentially decrease. The refractive index of the first sub-layer 13 adjacent to the first dielectric layer 20 is less than or equal to the refractive index of the first dielectric layer 20, and the refractive index of the second sub-layer 31 adjacent to the first dielectric layer 20 is less than or equal to the refractive index of the first dielectric layer 20.

It is to be understood that the first graded-refractive-index layer 10 including three first sub-layers and the second graded-refractive-index layer 30 including three second sub-layers shown in FIG. 2 are merely schematic. In other embodiments, the number of sub-layers in the first graded-refractive-index layer 10 and the number of sub-layers in the second graded-refractive-index layer 30 may also be different, which may be flexibly designed according to actual requirements in specific implementations. Additionally, it is to be noted that in specific implementations, both the first graded-refractive-index layer 10 and the second graded-refractive-index layer 30 are a unitary layer structure. A hierarchical structure is shown only to represent the variation of the refractive index, and there is no obvious hierarchical structure in an actual structure. When the first graded-refractive-index layer 10 and the second graded-refractive-index layer 30 are prepared, a flow rate of introduced gas may be gradually increased or decreased in a film formation process according to an order of graded refractive indexes, thereby reducing the process difficulty and improving the feasibility of the composite membrane. It is to be noted that the first graded-refractive-index layer 10 includes at least two first sub-layers and the second graded-refractive-index layer 30 includes at least two second sub-layers in the present disclosure. The gradient of the films can be achieved only by providing at least two or more sub-layers. Meanwhile, the reflection can be reduced, and the reflection hue can be improved and adjusted.

According to the technical scheme of the embodiment of the present disclosure, the refractive index of the first dielectric layer 20 is greater than or equal to the refractive indexes of the first graded-refractive-index layer 10 and the second graded-refractive-index layer 30, such that the film structure with variable refractive indexes is formed. Both the first graded-refractive-index layer 10 and the second graded-refractive-index layer 20 include at least two sub-layers, such that the interface between media is weakened. The reduction of the reflected light and the improvement of the transmitted light are achieved by synthesizing the thin film interference principle and the refractive index gradient principle. In the preparation process, both the first graded-refractive-index layer 10 and the second graded-refractive-index layer 30 are the unitary layer material which can be formed by the one-step process, which is conducive to reducing the process difficulty and the preparation cost. The relationship between the refractive index and the thickness of each sub-layer in the graded-refractive-index layer is comprehensively adjusted, such that the hue adjustment is achieved, and the composite membrane satisfies the requirements of low reflectivity and hue.

On the basis of the above-mentioned embodiment, in an embodiment, both the first graded-refractive-index layer 10 and the second graded-refractive-index layer 30 include silicon oxynitride. In the direction from the first graded-refractive-index layer 10 to the first dielectric layer 20, a mass proportion of nitrogen gradually increases and a mass proportion of oxygen gradually decreases in the first graded-refractive-index layer 10, and a mass proportion of the nitrogen gradually decreases and a mass proportion of the oxygen gradually increases in the second graded-refractive-index layer 30.

Figure 3:
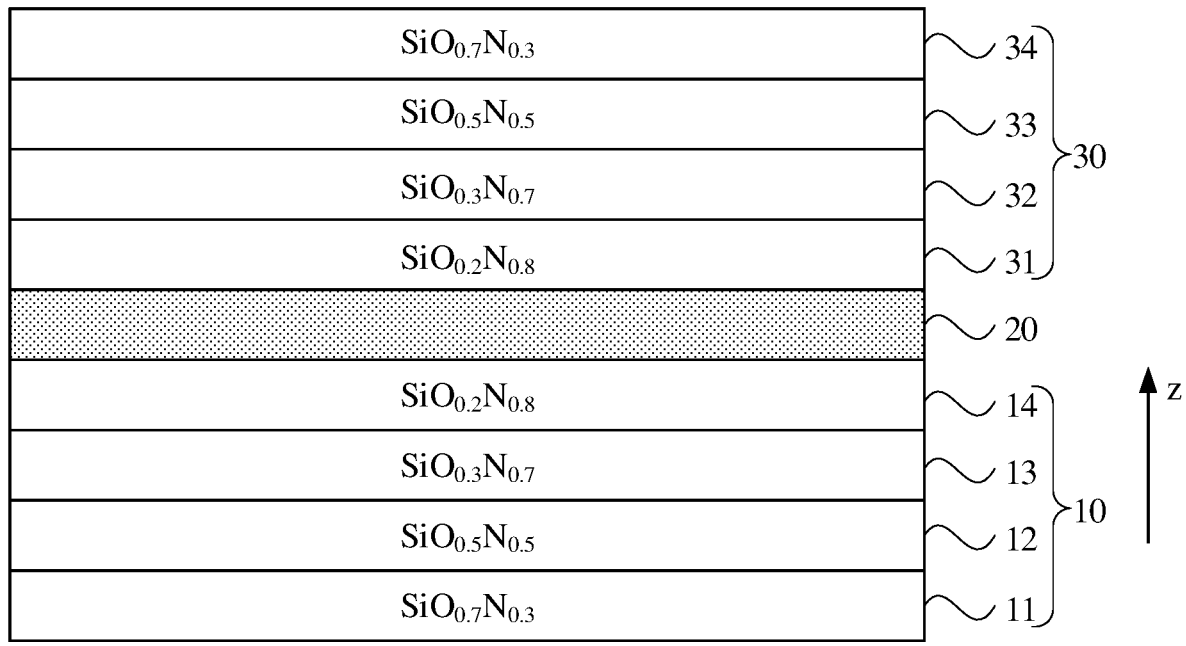
FIG. 3 is a structural diagram of another composite membrane according to an embodiment of the present disclosure.
Figure 4:
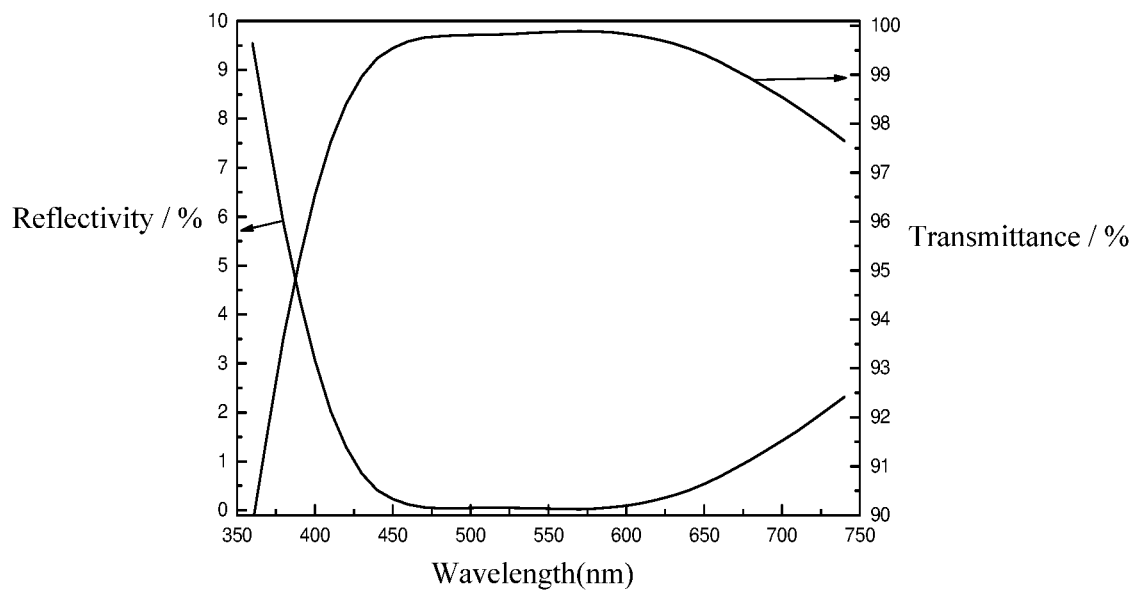
FIG. 4 is a schematic diagram illustrating simulation results of transmittance and reflectivity of a composite membrane according to an embodiment of the present disclosure.

Exemplarily, FIG. 3 is a structural diagram of another composite membrane according to an embodiment of the present disclosure. Referring to FIG. 3, the first graded-refractive-index layer 10 includes four first sub-layers 11, 12, 13 and 14, which are sequentially designed as $SiO_{0.7}N_{0.3}$, $SiO_{0.5}N_{0.5}$, $SiO_{0.3}N_{0.7}$ and $SiO_{0.2}N_{0.8}$; and the second graded-refractive-index layer 30 includes four second sub-layers 31, 32, 33 and 34, which are sequentially designed as $SiO_{0.2}N_{0.2}$, $SiO_{0.3}N_{0.7}$, $SiO_{0.5}N_{0.5}$ and $SiO_{0.7}N_{0.3}$, thereby achieving the variations of the refractive indexes of the first graded-refractive-index layer 10 and the refractive indexes of the second graded-refractive-index layer 30, respectively. In other embodiments, a finer sub-layer structure design may be achieved by controlling flow rates of different introduced gases during preparation, which is not limited in the embodiment of the present disclosure. The refractive index of silicon oxynitride may be approximately graded between 1.45~2, and the refractive index of the first dielectric layer 20 is greater than or equal to the maximum refractive index of the graded-refractive-index layer formed of silicon oxynitride. In other embodiments, the graded-refractive-index layer may also be made of aluminum nitrogen oxides, metal halide and the like, and it is only necessary to select a material with an adjustable element ratio to prepare the film with variable refractive indexes. The material can be flexibly selected according to an actual preparation process in each specific implementation, which is not limited in the embodiment of the present disclosure. In an embodiment, the first dielectric layer 20 includes any one of niobium pentoxide ($Nb_2O_5$), titanium dioxide ($TiO_2$), silicon nitride ($SiN_x$), indium tin oxide (ITO), fluorine-doped tin oxide (FTO), aluminum-doped zinc oxide (AZO), boron-doped zinc oxide (BZO) or gallium-doped zinc oxide (GZO), which can be flexibly selected according to an actual condition in each specific implementation. When the composite membrane is used on the solar cell, the first dielectric layer 20 may also be crystalline silicon, and it only needs to be ensured that the first dielectric layer 20 is the film with the largest refractive index in the composite membrane. FIG. 4 is a schematic diagram illustrating simulation results of the transmittance and the reflectivity of a composite membrane according to an embodiment of the present disclosure. Referring to FIG. 4, by using a computer simulation, the reflectivity of the composite membrane provided by this embodiment is less than or equal to 0.1416% and the transmittance of the composite membrane is greater than or equal to 99.85% in a visible light spectrum.

In an embodiment, the number of first sub-layers is the same as the number of second sub-layers, and a first sub-layer and a second sub-layer at symmetric positions relative to the first dielectric layer 20 have the same refractive index.

Exemplarily, still referring to FIG. 3, the first sub-layers include four layers 11, 12, 13 and 14, and the second sub-layers include four layers 31, 32, 33 and 34. The first sub-layer 11 and the second sub-layer 34 symmetrically disposed relative to the first dielectric layer 20 have the same refractive index (both the first sub-layer 11 and the second sub-layer 34 are $Si_{0.7}N_{0.3}$); the first sub-layer 12 and the second sub-layer 33 have the same refractive index (both the first sub-layer 12 and the second sub-layer 33 are $SiO_{0.5}N_{0.5}$); the first sub-layer 13 and the second sub-layer 32 have the same refractive index (both the first sub-layer 13 and the second sub-layer 32 are $SiO_{0.3}N_{0.7}$); and the first sub-layer 14 and the second sub-layer 31 have the same refractive index (both the first sub-layer 14 and the second sub-layer 31 are $SiO_{0.2}N_{0.8}$). In this way, the uniformity of the light transmission can be improved. In addition, materials on two sides of the first dielectric layer 20 are the same, such that the process conditions do not need to be switched during preparation, which is conducive to reducing the cost. In other embodiments, the number of first sub-layers and the number of second sub-layers may be different, and the first sub-layer and the second sub-layer at the symmetric positions relative to the first dielectric layer 20 may have different refractive indexes, which may be selected according to the actual process condition in each specific implementation.

Figure 5:
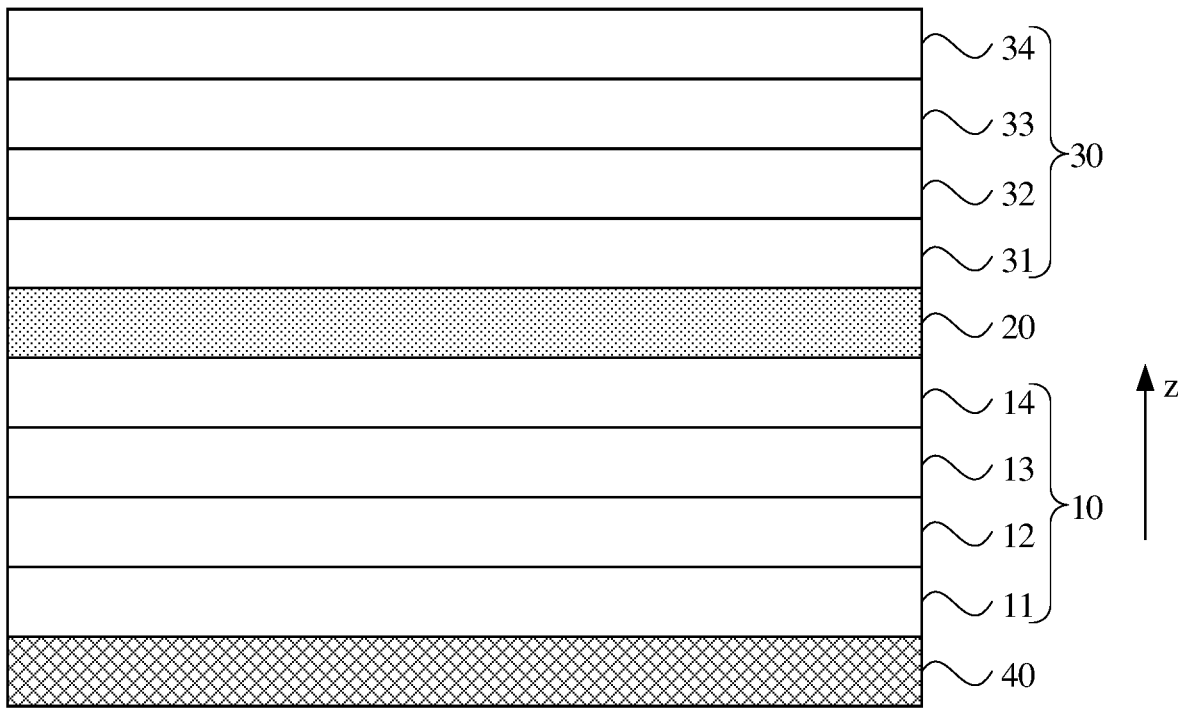
FIG. 5 is a structural diagram of another composite membrane according to an embodiment of the present disclosure.

FIG. 5 is a structural diagram of another composite membrane according to an embodiment of the present disclosure. Referring to FIG. 5, in an embodiment, the composite membrane provided by this embodiment further includes a first substrate 40. The first substrate 40 is disposed on a side of the first graded-refractive-index layer 10 facing away from the first dielectric layer 20, and the refractive index of the first substrate 40 is less than or equal to the refractive index of the first sub-layer 11 adjacent to the first substrate 40.

It is to be understood that the composite membrane provided by this embodiment may be disposed on a light emitting surface side of the display panel for improving the display quality. The display panel may be a liquid crystal display panel (LCD), an organic light emitting display panel (OLED), a Micro-LED display panel or the like. The first substrate 40 serves as a base substrate for the preparation of the composite membrane, and may, for example, be a glass substrate. In specific implementations, the first substrate 40 may be reused as a protection cover plate on the light emitting side of the display panel, so as to simplify the structure of the display panel and reduce the manufacturing cost.

Figure 6:
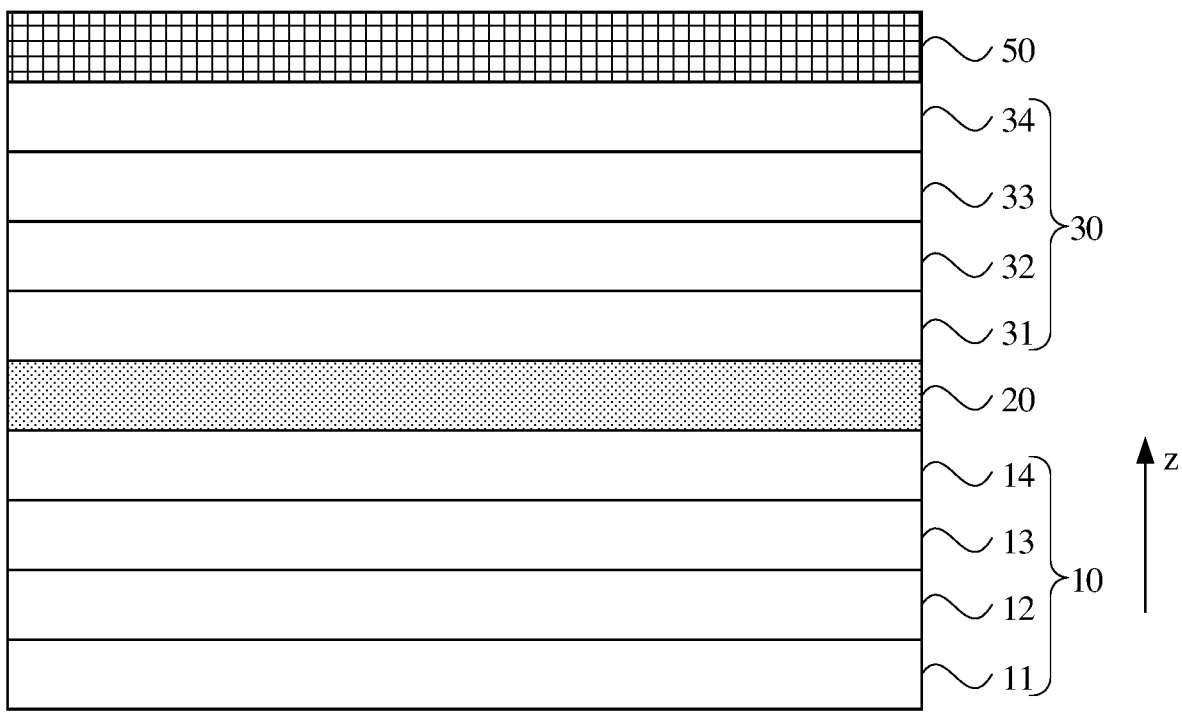
FIG. 6 is a structural diagram of another composite membrane according to an embodiment of the present disclosure.

FIG. 6 is a structural diagram of another composite membrane according to an embodiment of the present disclosure. Referring to FIG. 6, in an embodiment, the composite membrane provided by this embodiment further includes a second dielectric layer 50 disposed on a side of the second graded-refractive-index layer 30 facing away from the first dielectric layer 20. The refractive index of the second dielectric layer 50 is less than or equal to the refractive index of the second sub-layer 34 adjacent to the second dielectric layer 50.

When the second graded-refractive-index layer 30 is formed of a silicon oxynitride material, and the uppermost sub-layer is formed of silicon oxide and has the refractive index of about 1.45, the refractive index of the uppermost sub-layer is still different from the refractive index of air. In order to match the refractive index of the light emitting surface of the second graded-refractive-index layer 30 with the refractive index of air, the second dielectric layer 50 having a lower refractive index may be provided, thereby avoiding too large a change in the refractive index of the light emitting interface and improving the display quality.

In specific implementations, the second dielectric layer 50 is made of a material having a refractive index as low as possible. For example, the refractive index of the film may be adjusted by using fluoride or fluorine-containing acrylate polymer or prepolymer with a low refractive index. In an embodiment, the second dielectric layer 50 includes magnesium fluoride, a fluorine-containing methacrylate copolymer, a copolymer of vinylidene fluoride and tetrafluoroethylene, a copolymer of fluorine-containing monofunctional methacrylate and polyfunctional methacrylate or a copolymer of fluorine-containing difunctional methacrylate and polyfunctional methacrylate, where the refractive index of such fluorine-containing polymers is generally between 1.25~1.45. In addition, when the magnesium fluoride is selected for the second dielectric layer 50 and the composite membrane is used on the display panel, fingerprints can be prevented from being left on the display panel when the display panel is touched by fingers, such that the display effect is improved. In other embodiments, the material of the second dielectric layer 50 is not limited to the above materials, and it is only necessary to set the second dielectric layer 50 as the material with the lowest refractive index in the composite membrane.

Since touch is a very simple and convenient interaction mode, a rise in popularity of capacitive touch screens is followed by the continuous popularization of smart phones around the world. Currently, the capacitive touch screen has been widely applied in the electronic product fields in devices such as smart phones, tablets, media players, digital cameras and vehicle navigations. In the future, touch screens will be applied in even more devices and fields, such as integrated computers, public information billboards, and education and training. Currently, in the preparation process of the capacitive touch screen, a transparent conductive film is formed on a substrate, the transparent conductive film is etched to form electrodes, and a production of a touchpad is completed. Since the transparent conductive film has a certain thickness and the transparent conductive film is a thin film material with weak optical absorption, a color difference is produced between the etched transparent conductive film and a substrate region, and etching traces may be clearly observed on the surface, which affects the appearance of the touchpad. The composite membrane structure provided by the embodiments of the present disclosure may further be used in the touchpad to ensure low reflectivity and achieve an effect of a shadow elimination layer.

An embodiment of the present disclosure further provides a touchpad including any one of the composite membranes shown in FIG. 1 to FIG. 3 or FIG. 5 in the above-mentioned embodiments. The first dielectric layer 20 includes at least one transparent conductive layer, and the first dielectric layer 20 constitutes a touch electrode layer.

It is to be understood that the touchpad provided by this embodiment may be a self-capacitive touchpad or a mutual capacitive touchpad. A touch electrode is formed through the transparent conductive layer in the first dielectric layer 20, and the touchpad may be formed outside the display panel in an Out-cell mode or may be integrated inside the display panel. In an embodiment, the transparent conductive layer includes any one of indium tin oxide (ITO), fluorine-doped tin oxide (FTO), aluminum-doped zinc oxide (AZO), boron-doped zinc oxide (BZO) or gallium-doped zinc oxide (GZO), which may be flexibly selected according to the actual condition in each specific implementation. In other embodiments, the transparent conductive layer may also include a thin film formed of metal, metal oxides, metal nanowires, graphene and the like, and it is only necessary to satisfy characteristics of transparency of the emitted light of the display device and conductivity.

According to the touchpad provided by the embodiment of the present disclosure, the first dielectric layer 20 constitutes the touch electrode layer, such that a touch function is achieved. The refractive index of the first dielectric layer 20 is greater than or equal to the refractive indexes of the first graded-refractive-index layer 10 and the second graded-refractive-index layer 30, such that the film structure with variable refractive indexes is formed. Both the first graded-refractive-index layer 10 and the second graded-refractive-index layer 30 include at least two sub-layers, such that the interface between media is weakened, and the reduction of the reflected light and improvement of the transmitted light are achieved. In the preparation process, both the first graded-refractive-index layer 10 and the second graded-refractive-index layer 30 are the unitary layer material which can be formed by the one-step process, which is conducive to reducing the process difficulty and the preparation cost.

Figure 7:
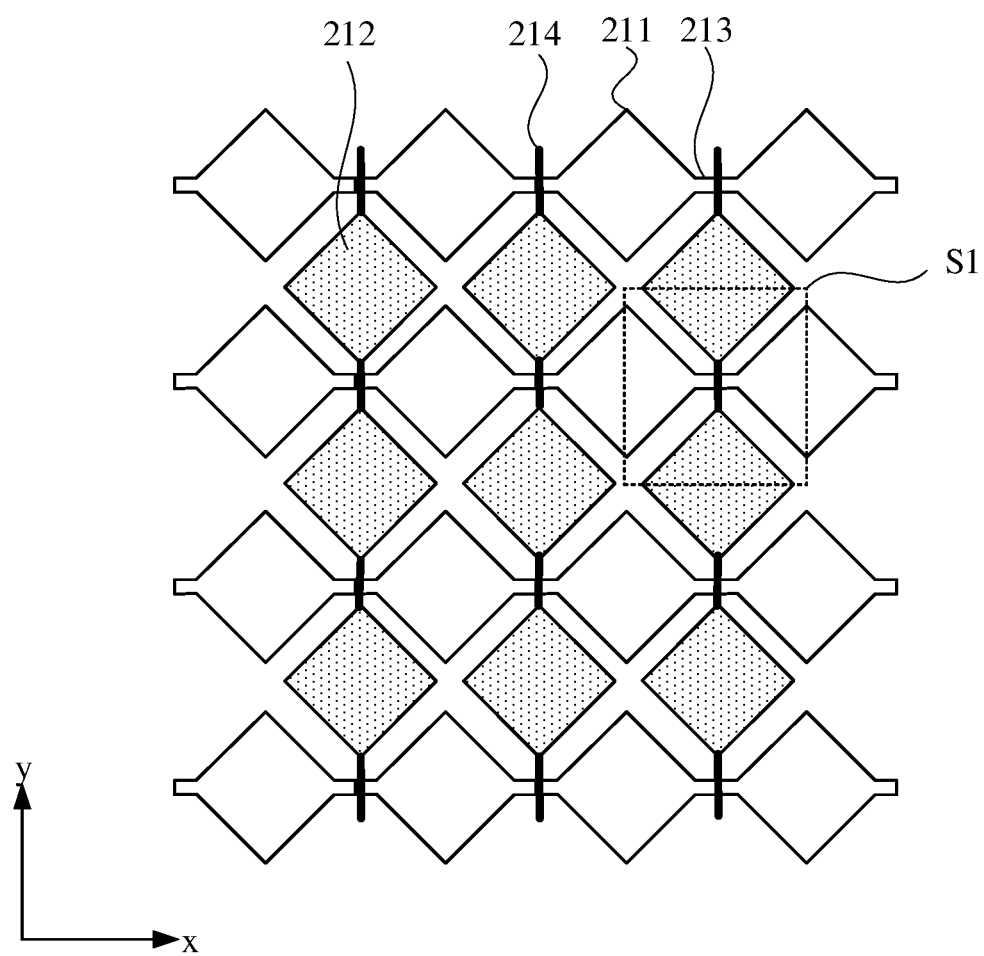
FIG. 7 is a top view of a first dielectric layer of a touchpad according to an embodiment of the present disclosure.
Figure 8:
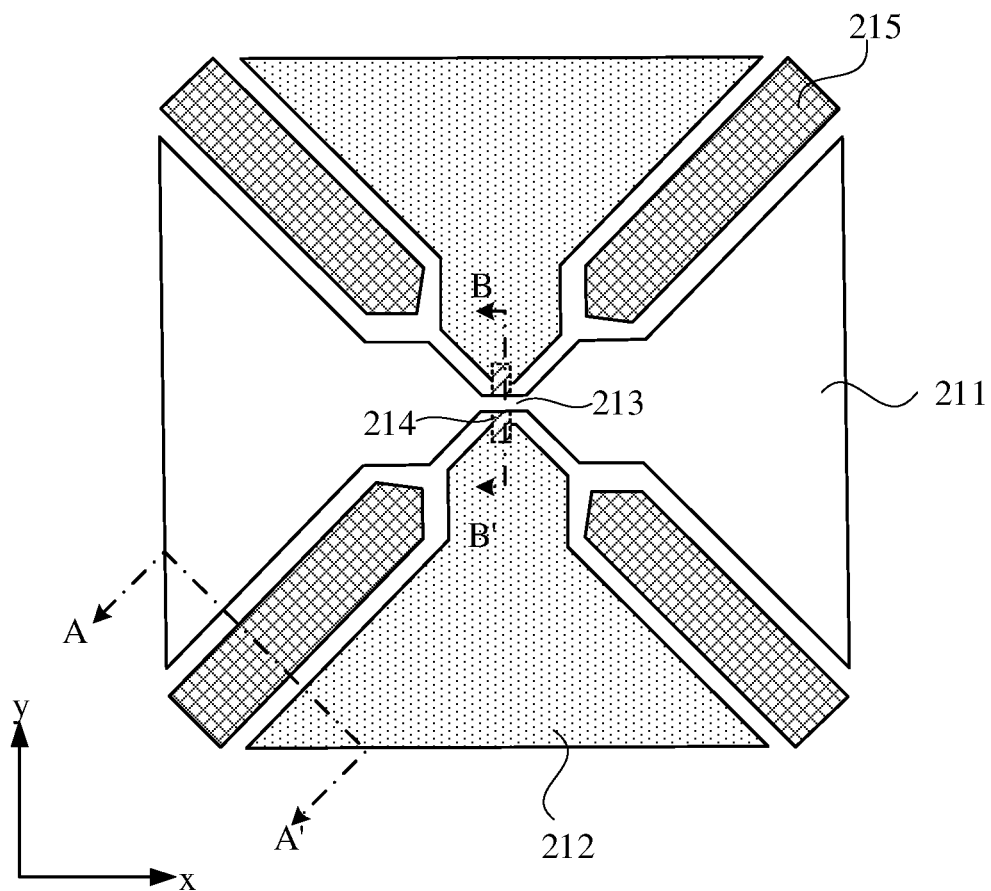
FIG. 8 is an enlarged view of a region S1 in FIG. 7.
Figure 9:
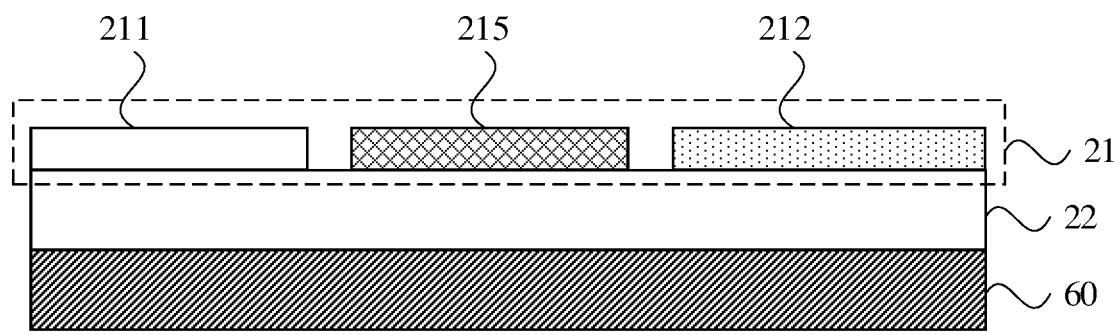
FIG. 9 is a cross-sectional view taken along a section line AA' of FIG. 8.
Figure 10:
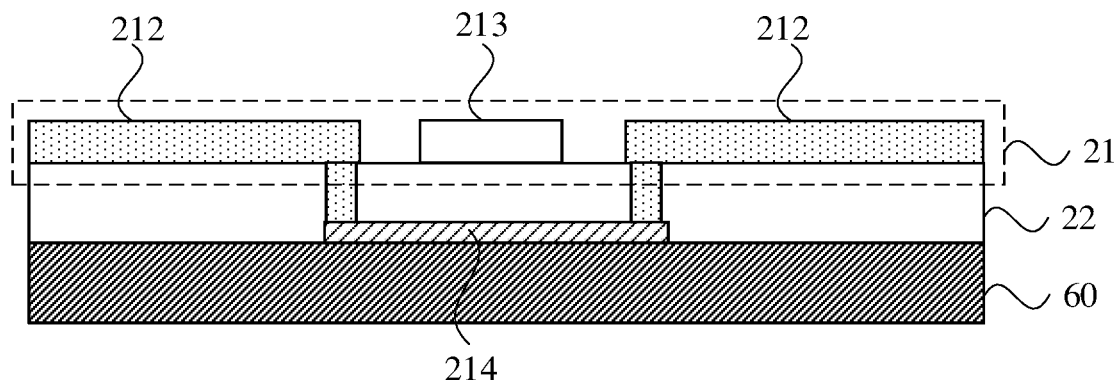
FIG. 10 is a cross-sectional view taken along a section line BB' of FIG. 8.

Exemplarily, the mutual capacitive touchpad is taken as an example. FIG. 7 is a top view of a first dielectric layer of a touchpad according to an embodiment of the present disclosure. FIG. 8 is an enlarged view of a region S1 in FIG. 7. FIG. 9 is a cross-sectional view taken along a section line AA' of FIG. 8. FIG. 10 is a cross-sectional view taken along a section line BB' of FIG. 8. Referring to FIG. 7 to FIG. 10, in an embodiment, the first dielectric layer 20 includes a first transparent conductive layer 21. The first transparent conductive layer 21 includes multiple first touch electrodes 211 arranged in a matrix and multiple second touch electrodes 212 arranged in a matrix, adjacent first touch electrodes 211 in the same matrix row are electrically connected to each other through a first connection component 213, and adjacent second touch electrodes 212 in the same matrix column are electrically connected to each other through a second connection component 214. The first connection component 213 and the first touch electrode 211 are disposed on the same layer. The first dielectric layer 20 further includes a first insulating layer 22. The first insulating layer 22 is disposed between a plane where the second connection component 214 is located and a plane where the second touch electrodes 212 is located.

Figure 11:
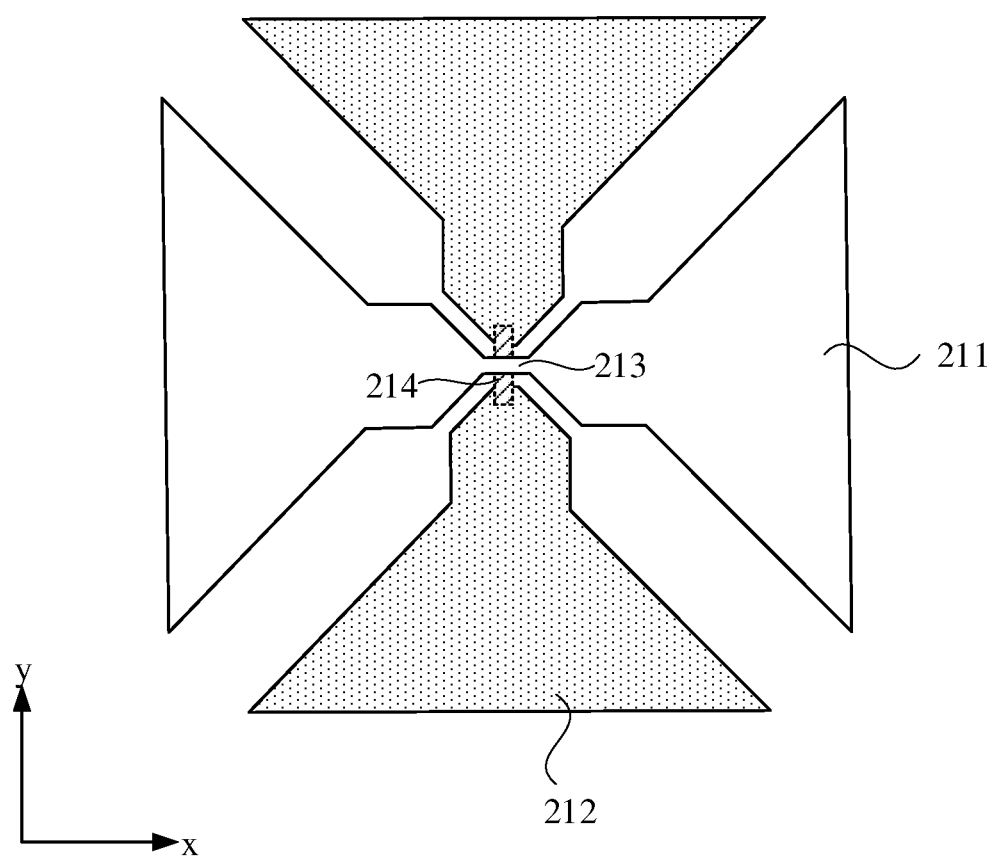
FIG. 11 is another enlarged view of the region S1 in FIG. 7.

A direction of the matrix row is an x-direction shown in FIG. 7, and a direction of the matrix column is a y-direction shown in FIG. 7. The first touch electrode 211 may be a touch drive electrode and the second touch electrode 212 may be a touch sense electrode. Alternatively, the first touch electrode 211 may be the touch sense electrode and the second touch electrode 212 may be the touch drive electrode. Referring to FIG. 8 and FIG. 9, in an embodiment, the touchpad further includes dummy electrodes 215 (in order to clearly illustrate the array formed by the first touch electrodes 211 and the second touch electrodes 212, the dummy electrodes 215 are omitted in FIG. 7). In this embodiment, the first touch electrodes 211, the second touch electrodes 212 and the dummy electrodes 215 are disposed on the same layer, and may be formed of the same material and in the same process, which saves the process and is conducive to reducing the cost. In other embodiments, the touchpad may not be provided with the dummy electrodes 215. Exemplarily, FIG. 11 is another enlarged view of the region S1 in FIG. 7. It is to be noted that the touch electrode and the dummy electrode in the drawings are only example shapes and may also be a rhombuses or other shapes designed according to design requirements, which is not limited herein. The first insulating layer 22 may be an inorganic layer, and, in an embodiment, the material of the inorganic layer may be silicon nitride or silicon oxynitride. The inorganic layer has a thinner thickness than an organic layer, which is conducive to decreasing the thickness of the touchpad. On the other hand, due to the limitation of the manufacturing process, the organic layer cannot be manufactured less than 1 micron, and the manufacturing process requires more time than the inorganic layer. Therefore, in the embodiment of the present disclosure, the inorganic layer is used for forming the first insulating layer 22 in the touchpad, thus saving manufacturing time of the touchpad and reducing the manufacturing difficulty.

In an embodiment, referring to FIG. 9 and FIG. 10, the touchpad further includes a second substrate 60. The second substrate 60 may be a rigid substrate, such as a glass substrate, or the second substrate 60 may be a flexible substrate, such as a polyimide substrate. The first touch electrodes 211, the second touch electrodes 212 and the dummy electrodes 215 are all disposed on the same side of the second substrate 60. In the embodiment of the present disclosure, the touchpad further includes the second substrate 60, such that the first touch electrodes 211 and the second touch electrodes 212 can be formed on the second substrate 60. That is to say, in the embodiment of the present disclosure, the touchpad only has a touch function. For example, the touchpad may be formed outside the display panel in the Out-cell mode, or may be formed inside the display panel in an integrated mode. In this embodiment, the independent second substrate 60 is provided for the first touch electrodes 211 and the second touch electrodes 212, thus reducing the difficulty of manufacturing the touchpad. Still referring to FIG. 9 and FIG. 10, in terms of process, the preparation process of the touch display panel may be achieved through 3 masks, that is, the second connection components 214 are manufactured, the first insulating layer 22 and vias are manufactured, and the first touch electrodes 211, the second touch electrodes 212 and the first connection components 213 are manufactured. Such a structure has a simple process, and when the structure is used in the display device, it is only necessary that a side of the first touch electrodes 211 facing away from the second substrate 60 is attached to the cover plate through an optical adhesive. In other embodiments, the second substrate 60 may be a certain substrate of the display panel (such as an upper substrate in the array substrate), and the touch electrodes are formed inside the display substrate to form an In-cell structure.

Figure 12:
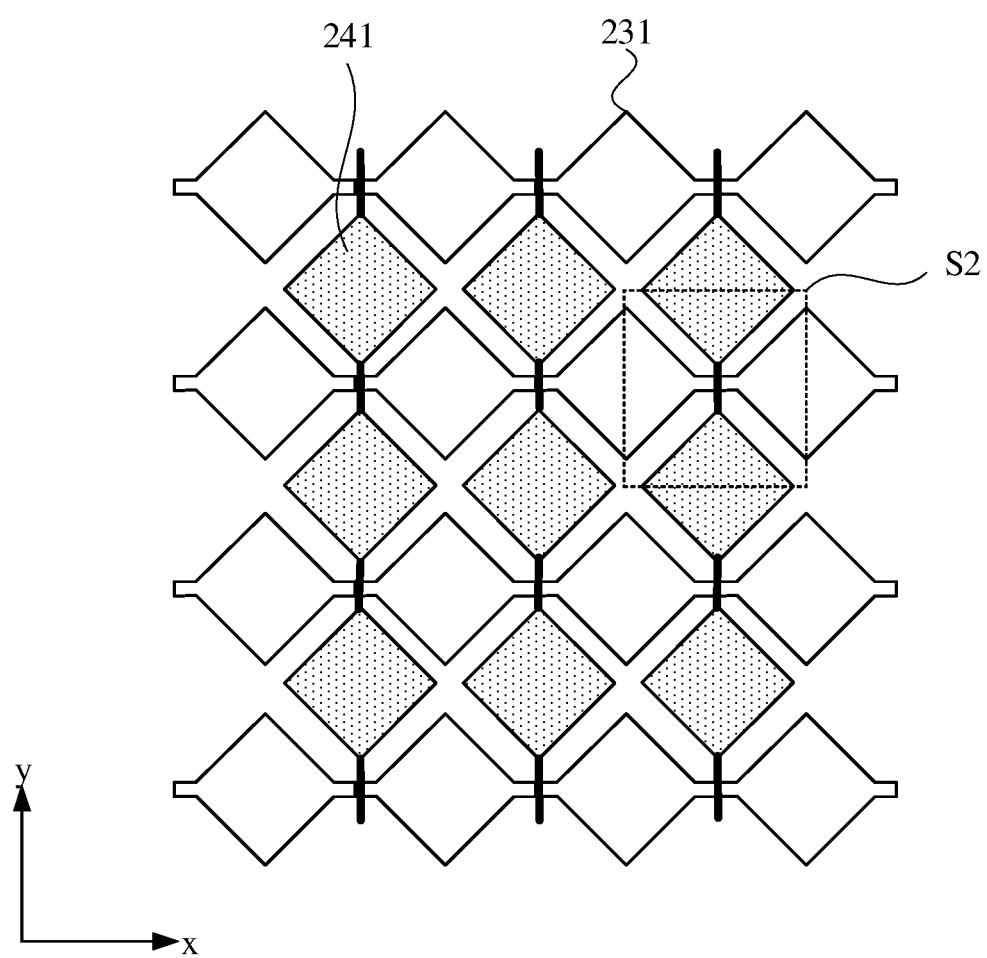
FIG. 12 is a top view of a first dielectric layer of another touchpad according to an embodiment of the present disclosure.
Figure 13:
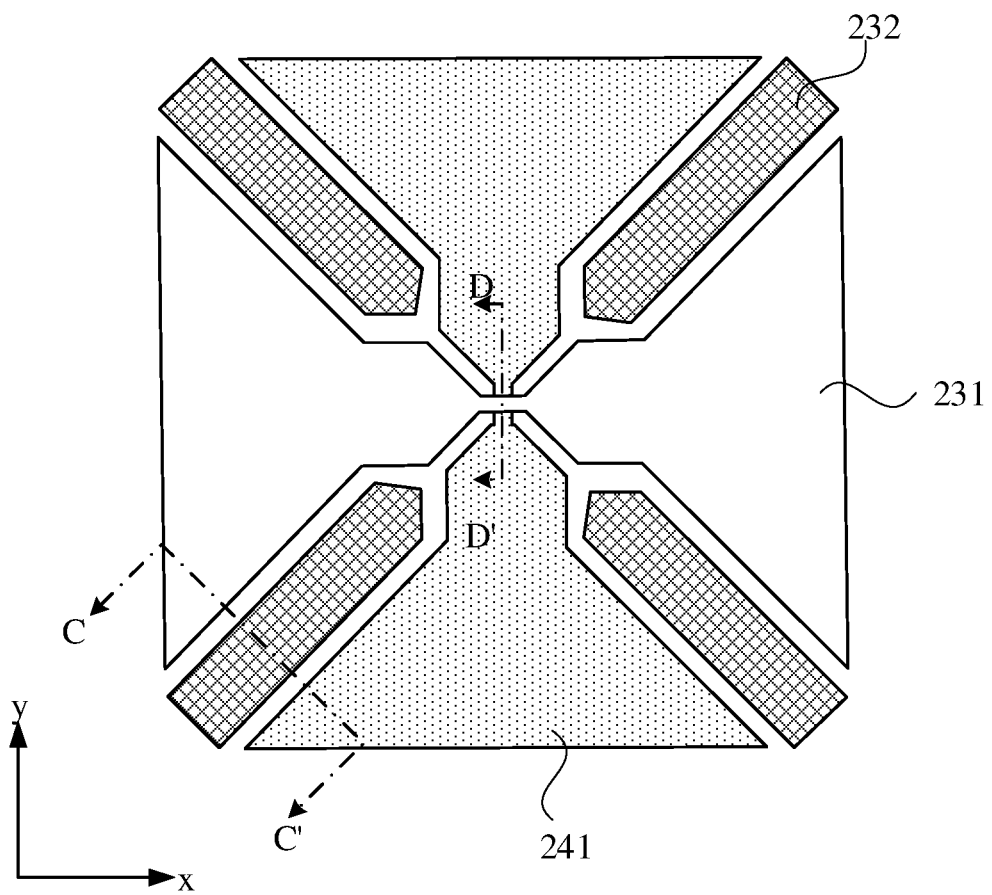
FIG. 13 is an enlarged view of a region S2 in FIG. 12.
Figure 14:
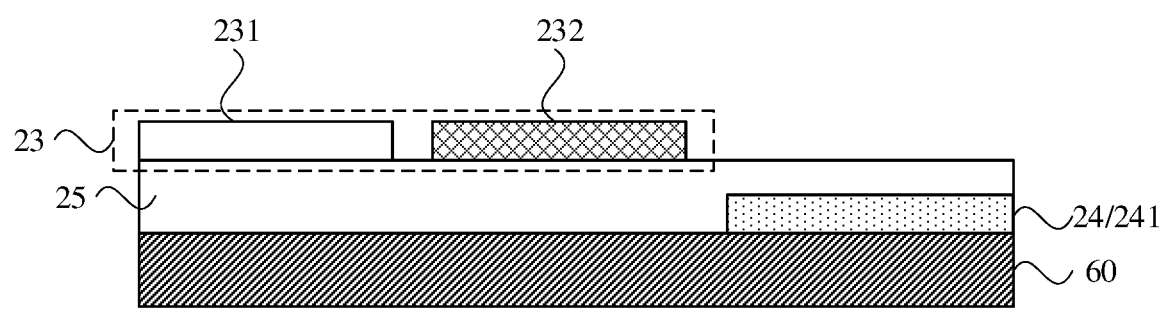
FIG. 14 is a cross-sectional view taken along a section line CC' of FIG. 13.
Figure 15:
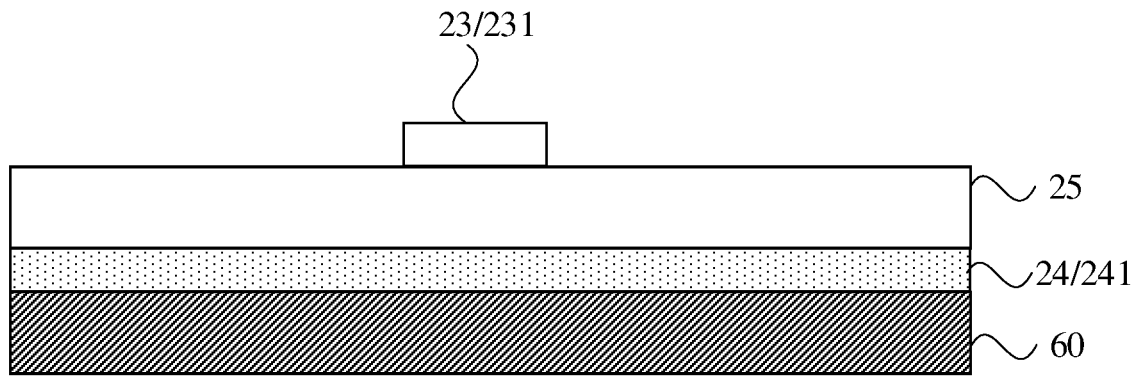
FIG. 15 is a cross-sectional view taken along a section line DD' of FIG. 13.

FIG. 12 is a top view of a first dielectric layer of another touchpad according to an embodiment of the present disclosure. FIG. 13 is an enlarged view of a region S2 in FIG. 12. FIG. 14 is a cross-sectional view taken along a section line CC' of FIG. 13. FIG. 15 is a cross-sectional view taken along a section line DD' of FIG. 13. Referring to FIG. 12 to FIG. 15, in an embodiment, the first dielectric layer 20 includes a second transparent conductive layer 23, a third transparent conductive layer 24 and a second insulating layer 25 disposed between the second transparent conductive layer 23 and the third transparent conductive layer 24. In an embodiment, the second insulating layer 25 may be silicon nitride or silicon oxynitride; the second transparent conductive layer 23 includes multiple third touch electrodes 231 arranged in a matrix, and adjacent third touch electrodes 231 in the same matrix row are electrically connected to each other; and the third transparent conductive layer 24 includes multiple fourth touch electrodes 241 arranged in a matrix, and adjacent fourth touch electrodes 241 in the same matrix column are electrically connected to each other.

The third touch electrode 231 may be a touch drive electrode and the fourth touch electrode 241 may be a touch sense electrode. Alternatively, the third touch electrode 231 may be the touch sense electrode and the fourth touch electrode 241 may be the touch drive electrode. Referring to FIG. 13, the touchpad further includes dummy electrodes 232 (in order to clearly illustrate the array formed by the third touch electrodes 231 and the fourth touch electrodes 241, the dummy electrodes 232 are omitted in FIG. 12). Referring to FIG. 14, it is only schematic that the dummy electrodes 232 are disposed on the second transparent conductive layer 23. In other embodiments, the dummy electrodes 232 may also be disposed on the third transparent conductive layer 24, or may be partially disposed on the second transparent conductive layer 23, and partially disposed on the third transparent conductive layer 24, which may be flexibly selected according to actual requirements in each specific implementation.

Figure 16:
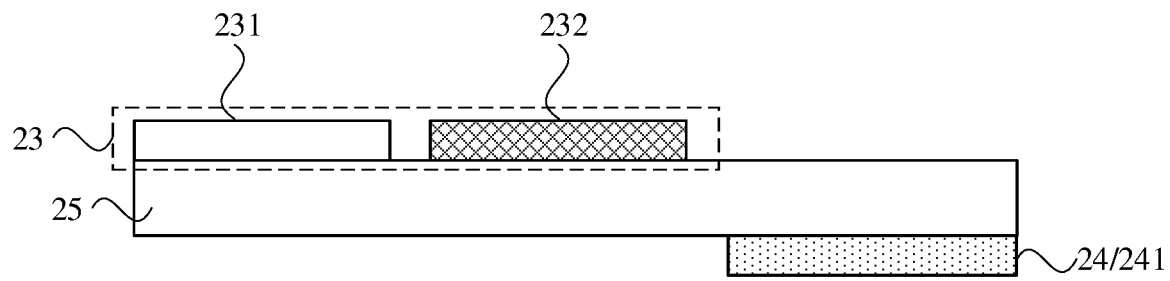
FIG. 16 is another cross-sectional view taken along the section line CC' of FIG. 13.
Figure 17:
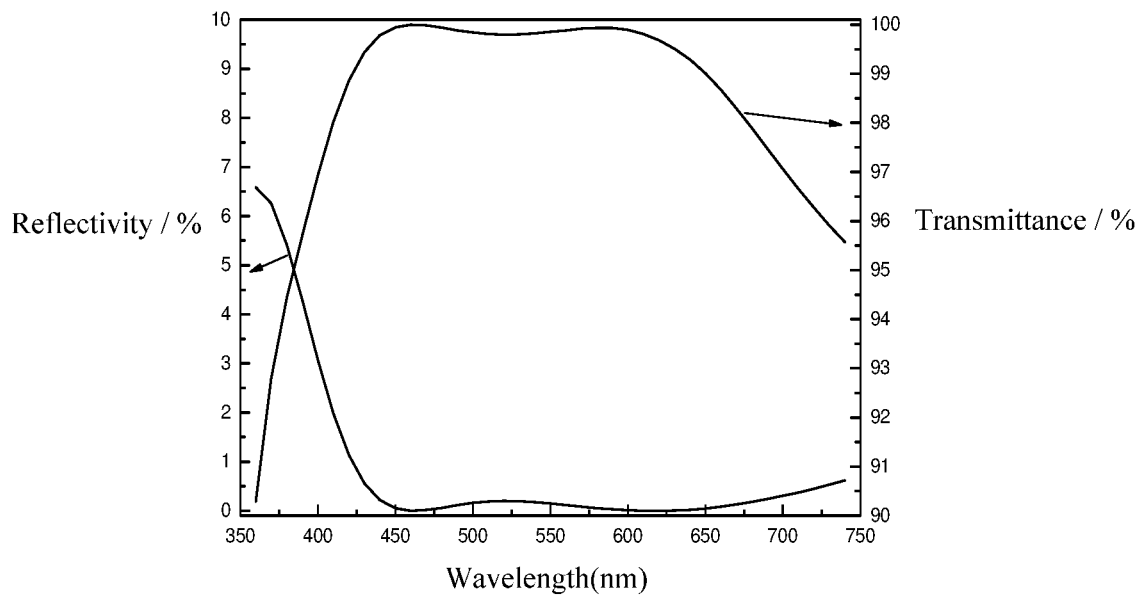
FIG. 17 is a schematic diagram illustrating simulation results of transmittance and reflectivity of a touchpad according to an embodiment of the present disclosure.

In an embodiment, referring to FIG. 14 and FIG. 15, the touchpad further includes the second substrate 60. In other embodiments, the second insulating layer 25 may serve as the substrate of the touchpad. FIG. 16 is another cross-sectional view taken along the section line CC' of FIG. 13. Referring to FIG. 16, the second insulating layer 25 serves as the substrate of the touchpad, and the third touch electrode 231 and the fourth touch electrode 241 are located on opposite two sides of the second insulating layer 25, respectively. FIG. 17 is a schematic diagram illustrating simulation results of transmittance and reflectivity of a touchpad according to an embodiment of the present disclosure. As can be seen from FIG. 17, the structure provided by this embodiment has high transmittance and low reflectivity in the visible light spectrum.

In specific implementations, a gap position between adjacent touch electrodes may be made of the material used for the graded-refractive-index layers. In an embodiment, the material is silicon oxynitride or silicon nitride, and the refractive index of the material used at the gap position may be controlled to be close to the refractive index of the transparent conductive layer, so as to weaken the visibility of the gap of the touch electrodes. In other embodiments, a unitary thin film may further be formed on the touch electrodes and the thin film automatically fills the gaps, thus ensuring that the refractive index of the film on the touch electrodes is less than or equal to the refractive index of the touch electrodes. It may also newly add a mask process to fill only the gap positions, in which case it is necessary to ensure that the refractive index of the material at the gap positions is similar to or the same as the refractive index of the touch electrodes. A mask process may also be newly added. That is, a relevant film is first formed in a whole surface mode, a region above the touch electrodes is etched off, and only the material at the gap positions is left. Meanwhile, it should be ensured that the refractive index of the material is similar to or the same as the refractive index of the electrodes.

An embodiment of the present disclosure further provides a display device including a display module and any one of the composite membranes and/or any one of the touchpads provided by the above-mentioned embodiments and disposed on a light emitting surface side of the display module.

The display device provided by this embodiment may be a mobile phone, a tablet, a smart wearable device and the like. The display module may be a liquid crystal display module, and the liquid crystal display module includes a backlight, an array substrate, a color filter substrate and a liquid crystal layer located between the array substrate and the color filter substrate. The display module may also be an organic light emitting display module or a Micro-LED display module, which may be selected according to actual conditions in each specific implementation.

When the display device provided by this embodiment includes the composite membrane provided by the above-mentioned embodiments, the composite membrane can effectively reduce the reflectivity of the light emitted by the display module, so as to improve the display quality of the display device. When the display device provided by this embodiment includes the touchpad provided by the above-mentioned embodiments, the touch function may be provided, and an etching pattern of the touch electrode is invisible while ensuring an overall ultra-low reflectivity. When the display device provided by this embodiment includes the composite membrane and the touchpad provided by the above-mentioned embodiments, the effects of the above two aspects are achieved.

Figure 18:
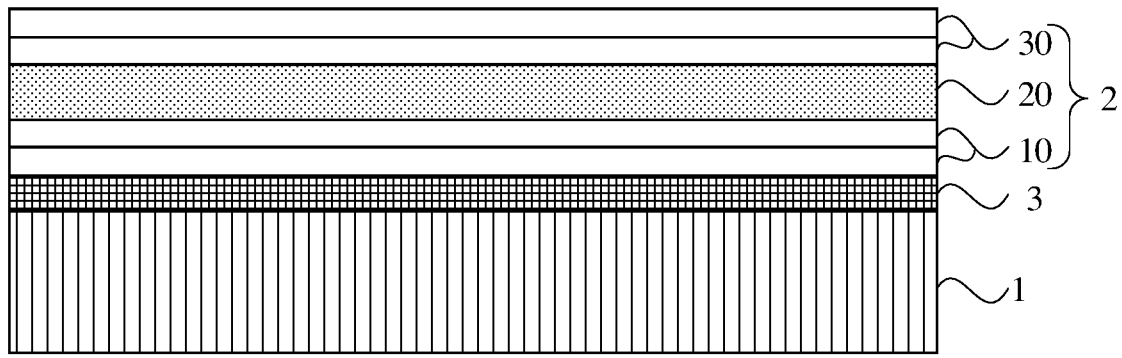
FIG. 18 is a structural diagram of a display device according to an embodiment of the present disclosure.

FIG. 18 is a structural diagram of a display device according to an embodiment of the present disclosure. Referring to FIG. 18, in an embodiment, the display device includes a display module 1 and a composite membrane 2, and the composite membrane 2 is attached to the light emitting surface side of the display module 1 through an optical adhesive 3.

The display module 1 may be a liquid crystal display module, an organic light emitting display module, or a Micro-LED display module, or it may be a display module based on other principles. The composite membrane 2 may be any one of the composite membranes provided by the above-mentioned embodiments. FIG. 18 only schematically shows the first graded-refractive-index layer 10, the first dielectric layer 20 and the second graded-refractive-index layer 30, and only two sub-layers are shown in both the first graded-refractive-index layer 10 and the second graded-refractive-index layer 30. For simplicity, no sub-layer is shown in the following embodiments, which is not intended to limit the embodiment of the present disclosure.

Figure 19:
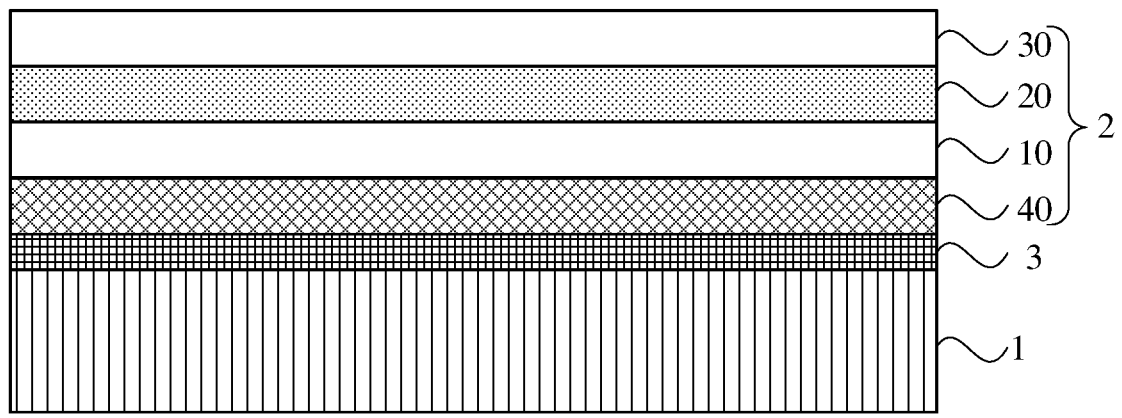
FIG. 19 is a structural diagram of another display device according to an embodiment of the present disclosure.

FIG. 19 is a structural diagram of another display device according to an embodiment of the present disclosure. Referring to FIG. 19, in an embodiment, the composite membrane 2 includes a first substrate 40. The first substrate 40 is disposed at a side of the first graded-refractive-index layer 10 of the composite membrane 2 facing away from the first dielectric layer 20, and the first substrate 40 is attached to the light emitting surface side of the display module 1 through the optical adhesive 3.

It is to be understood that in other embodiments, a certain film in the display module 1 may be reused as the first substrate 40 of the composite membrane 2. For example, when the display module 1 is the liquid crystal display module, a glass cover plate or a polarizer in the color filter substrate may be reused as the first substrate 40. When the display module 1 is the organic light emitting display module, a package substrate may be reused as the first substrate 40. In an embodiment, the package substrate may be a rigid package substrate, so as to simplify the film structure of the display device, reduce the thickness of the display device and reduce the cost.

In an embodiment, the display device includes the display module and the touchpad.

Figure 20:
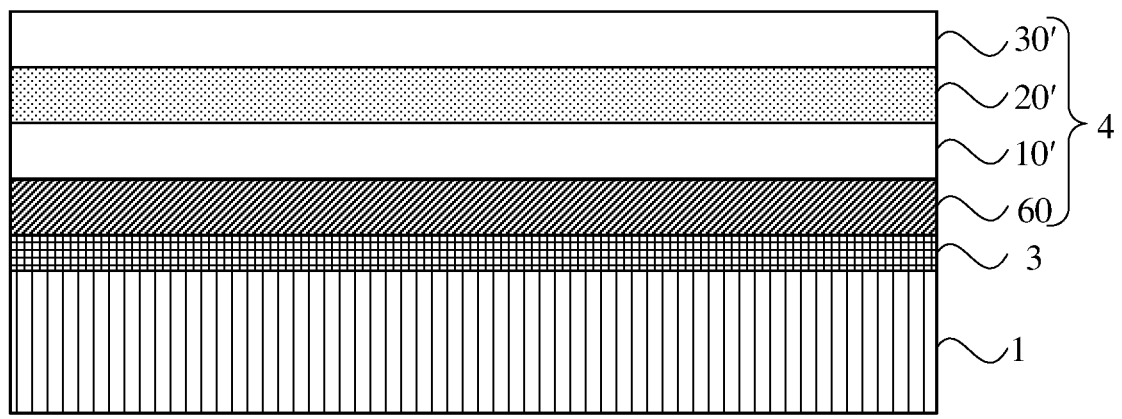
FIG. 20 is a structural diagram of another display device according to an embodiment of the present disclosure.
Figure 21:
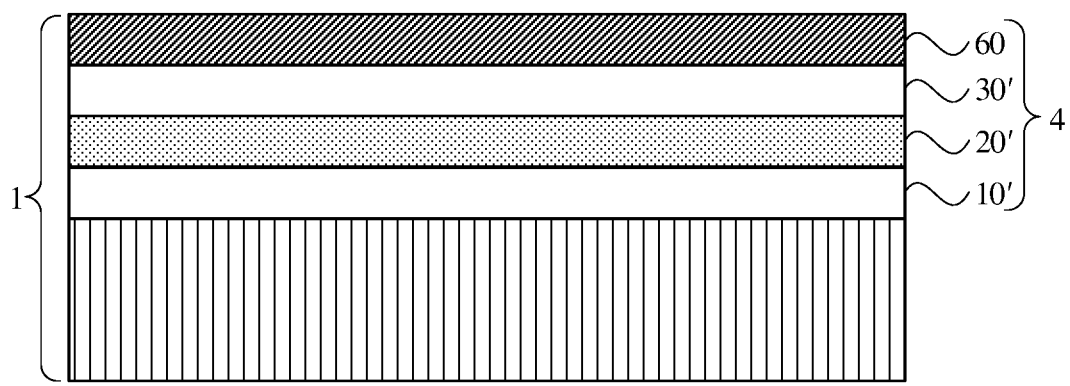
FIG. 21 is a structural diagram of another display device according to an embodiment of the present disclosure.

FIG. 20 is a structural diagram of another display device according to an embodiment of the present disclosure, and FIG. 21 is a structural diagram of another display device according to an embodiment of the present disclosure. The display device includes the display module 1 and the touchpad 4. The touchpad 4 includes a first graded-refractive-index layer 10', a first dielectric layer 20' (the touch electrode layer) and a second graded-refractive-index layer 30' (sub-layers are not shown in FIGS. 20 and 21) which are stacked in sequence. In a direction from the display module 1 to the first dielectric layer 20', refractive indexes of the first graded-refractive-index layer 10' sequentially increase, and refractive indexes of the second graded-refractive-index layer 30' sequentially decrease. Referring to FIG. 20, in an embodiment, the touchpad 4 further includes a second substrate 60, the second substrate 60 is disposed at a side of the first graded-refractive-index layer 10' of the touchpad 4 facing away from the first dielectric layer 20', and the second substrate 60 is attached to the light emitting surface side of the display module 1 through the optical adhesive 3. Alternatively, referring to FIG. 21, the second substrate 60 is disposed at a side of the second graded-refractive-index layer 30' of the touchpad 4 facing away from the first dielectric layer 20', a surface of a side of the second substrate 60 facing away from the second graded-refractive-index layer 30' is the light emitting surface of the display module 1, and the touchpad 4 is disposed in the display module 1.

It is to be understood that the structure shown in FIG. 20 is an Out-cell structure of the touchpad, and the Out-cell structure has advantages of simple structure and low cost. The structure shown in FIG. 21 is an In-cell structure in which the touchpad 4 is embedded in the display module 1, which may be flexibly selected according to actual requirements in each specific implementation. The In-cell structure has advantages of high integration level, and is favorable for achieving thinning and lightening of the display device. Exemplarily, when the display module 1 is the liquid crystal display module, the touchpad 4 may be disposed on a side of the color filter substrate, for example, between the base substrate of the color filter substrate and a black matrix layer; or the touchpad 4 may be disposed on a side of the array substrate, which may be flexibly selected according to actual conditions and process conditions in each specific implementation.

Figure 22:
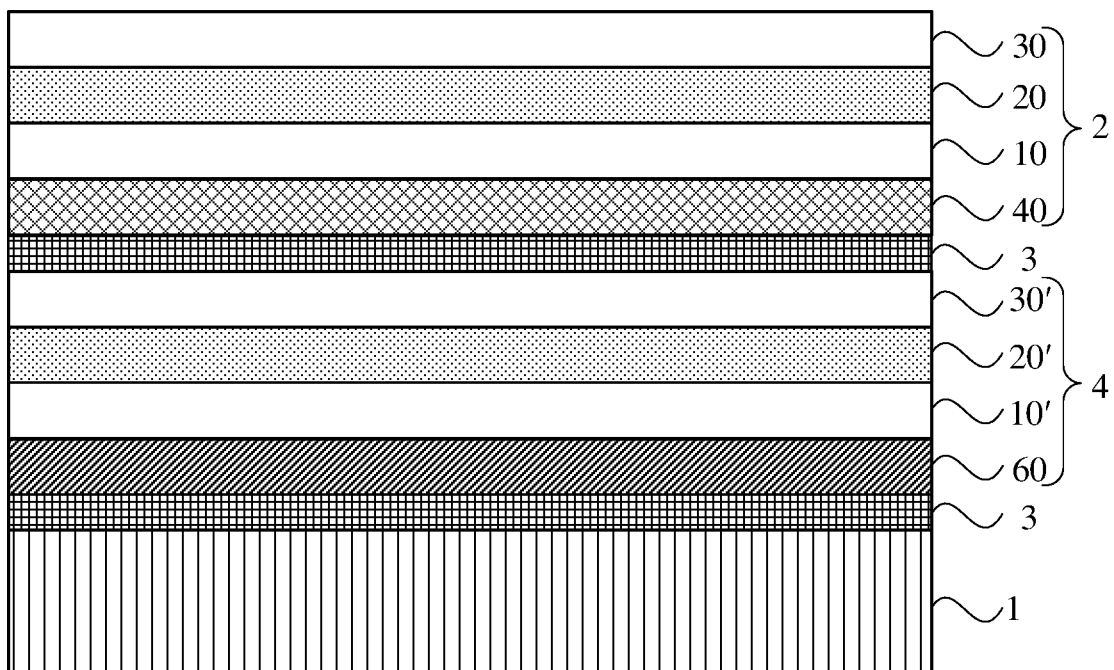
FIG. 22 is a structural diagram of another display device according to an embodiment of the present disclosure.

FIG. 22 is a structural diagram of another display device according to an embodiment of the present disclosure. Referring to FIG. 22, in an embodiment, the display device includes the display module 1, the composite membrane 2 and the touchpad 4. The touchpad 4 and the composite membrane 2 are sequentially stacked on the light emitting surface side of the display module 1.

The display device is configured to include the touchpad 4 and the composite membrane 2 provided by the above-mentioned embodiment, such that the touchpad 4 can enable the display device to have the touch function and the etching pattern of the touch electrode is invisible, while ensuring overall ultra-low reflectivity. The composite membrane 2 can effectively reduce the reflectivity of the light emitted by the display module 1, so as to improve the display quality of the display device.

In an embodiment, the touchpad 4 is attached to the light emitting surface of the display module 1 or disposed in the display module 1.

Still referring to FIG. 22, the touchpad 4 is attached to the light emitting surface of the display panel 1 through the optical adhesive 3, and the composite membrane 2 is attached to the side of the touchpad 4 facing away from the display module 1 through the optical adhesive 3 to form the display device with an On-cell touch structure.

Figure 23:
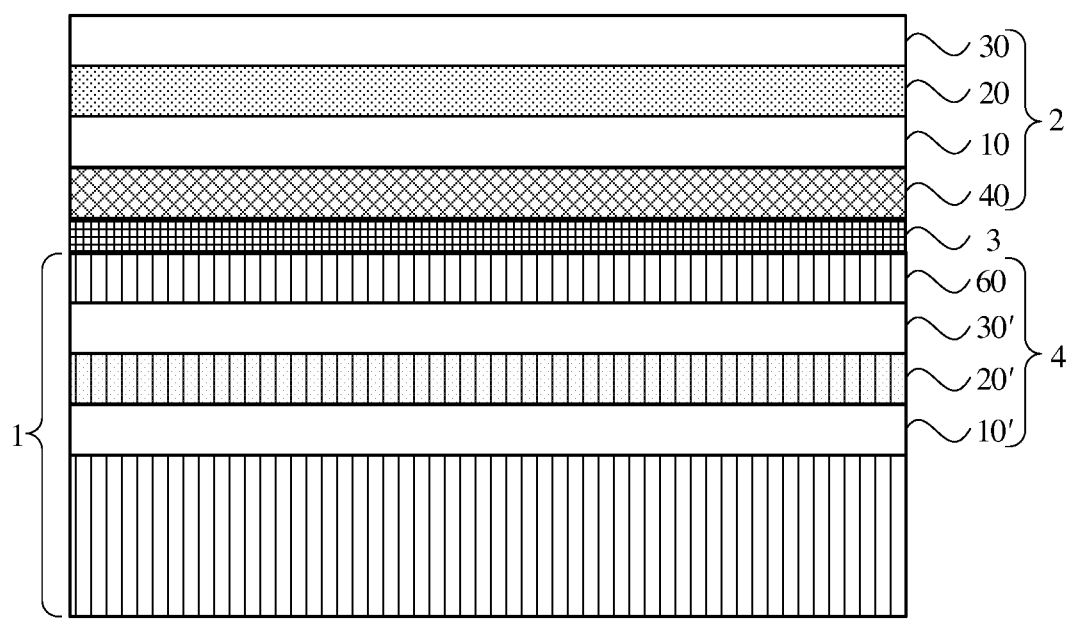
FIG. 23 is a structural diagram of another display device according to an embodiment of the present disclosure.

FIG. 23 is a structural diagram of another display device according to an embodiment of the present disclosure. Referring to FIG. 23, the substrate on the light emitting side of the display module 1 serves as the second substrate 60 of the touchpad 4, and the touchpad 4 is disposed inside the display module 1 to form the display device with an In-cell touch structure. The composite membrane 2 is attached to the light emitting surface of the display module 1 through the optical adhesive 3.

In other embodiments, the first substrate 40 of the composite membrane 2 may further be designed to be reused as the second substrate 60 of the touchpad 4, so as to simplify the film structure of the display device, thereby achieving the thinning and lightening of the display device.

Since the display device includes a display region and a non-display region, and the non-display region is used for arranging traces, peripheral circuits, and the like. In order to shield the traces and peripheral circuits, an ink layer is generally disposed in the non-display region. However, black states of the display region and the non-display region are inconsistent when a display function of the existing display device is turned off. An embodiment of the present disclosure further provides a display device. The display device includes a display region and a non-display region around the display region. The display device further includes a first ink layer and a first composite membrane. Both the first ink layer and the first composite membrane are disposed in the non-display region. The first ink layer and the display module are disposed on the same side of the composite membrane or the touchpad, and the first composite membrane is disposed between the first ink layer and the composite membrane or the first composite membrane is disposed between the first ink layer and the touchpad. A hue of the display region is fixed, and the first composite membrane is added between the first ink layer of the non-display region and the composite membrane, such that a hue of an ink region can be drawn closer to a middle display region by a film structure of the first composite membrane, and an effect that the hues are very close is achieved.

Figure 24:
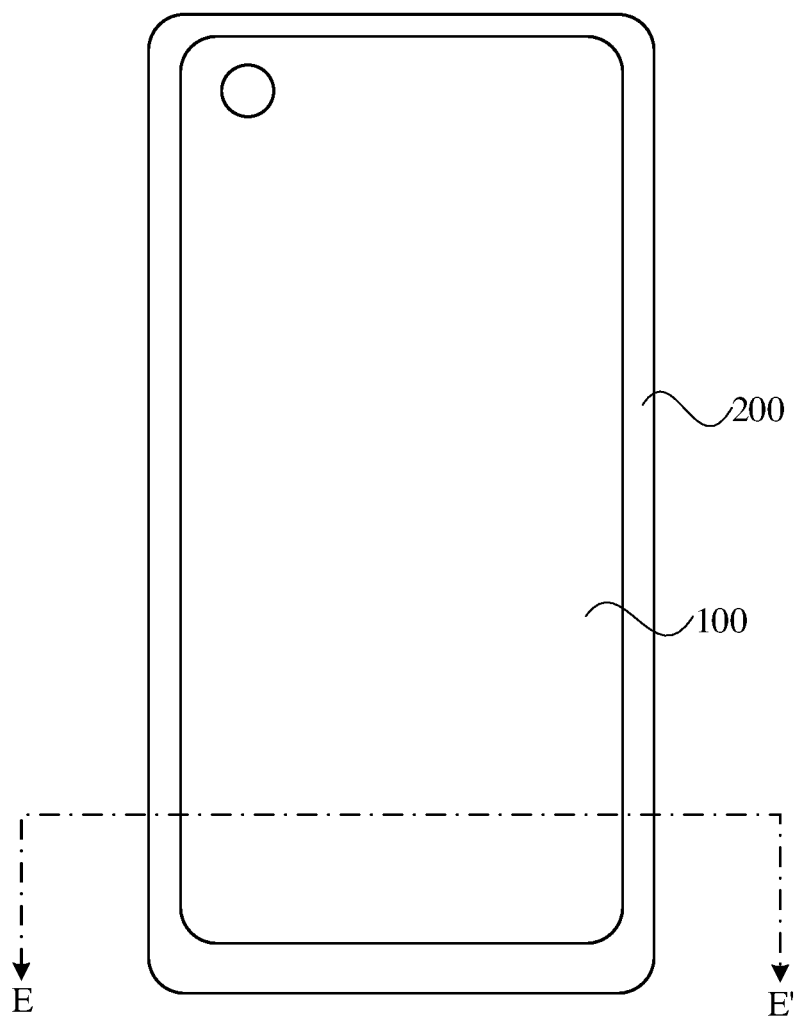
FIG. 24 is a top view of a display device according to an embodiment of the present disclosure.
Figure 25:
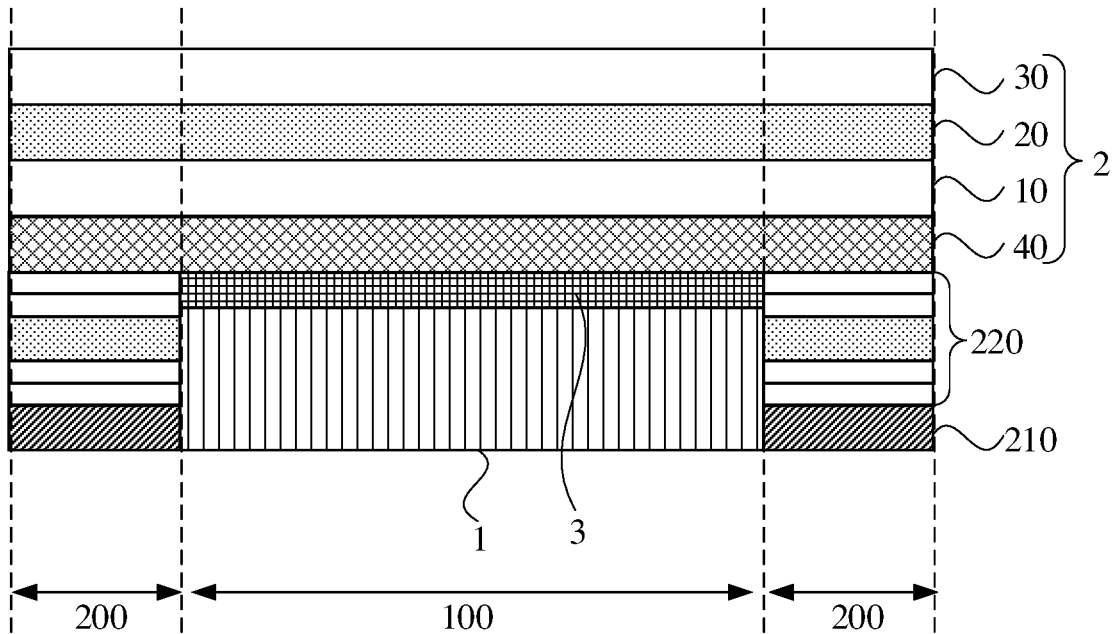
FIG. 25 is a cross-sectional view taken along a section line EE' of FIG. 24.

Exemplarily, it is shown that the display device only includes the composite membrane and does not include the touchpad. FIG. 24 is a top view of a display device according to an embodiment of the present disclosure. FIG. 25 is a cross-sectional view taken along a section line EE' of FIG. 24. When the display device includes the touchpad, for the Out-cell touch display device, the touchpad may be disposed between the composite membrane and the display module, and for the In-cell touch display device, the touchpad may be disposed in the display module. Referring to FIG. 24 and FIG. 25, in an embodiment, the display device includes a display region 100 and a non-display region 200 around the display region 100. The display device further includes a first ink layer 210 and a first composite membrane 220. Both the first ink layer 210 and the first composite membrane 220 are disposed in the non-display region 200, the first ink layer 210 and the display module 1 are disposed on the same side of the composite membrane 2, and the first composite membrane 220 is disposed between the first ink layer 210 and the composite membrane 2. The composite membrane 2 is attached to the light emitting side of the display module 1 through the optical adhesive 3.

The first composite membrane 220 is disposed on the first ink layer 210, so that a light reflection efficiency of the first ink layer 210 can be adjusted, which achieves a uniformity of black states of the display region 100 and the non-display region 200 when the display device is turned off.

The display module 1 shown in FIG. 25 may be the liquid crystal display module including a backlight module, a lower polarizer, a liquid crystal cell, an upper polarizer and the like, which are stacked sequentially from bottom to top, or the display module 1 may be the organic light emitting display panel or the Micro-LED display panel. It is only schematic that the graded-refractive-index layer in the first composite membrane 220 includes two sub-layers, which may be selected according to actual requirements in other embodiments. For simplification, no sub-layer structure of the graded-refractive-index layer is shown in the following embodiment.

In an embodiment, the display device includes the display region and the non-display region around the display region. The display device further includes a second ink layer and a second composite membrane. The second ink layer is disposed in the non-display region and the second composite membrane is disposed in the display region. The second ink layer and the display module are disposed on the same side of the composite membrane or the touchpad, and the second composite membrane is disposed between the display module and the composite membrane or the display module and the touchpad. A hue of a second ink region in the non-display region is fixed, and a hue of the middle display region is drawn closer to a hue of a peripheral ink region by a film structure of the second composite membrane, such that the effect that the hues are very close is achieved.

Figure 26:
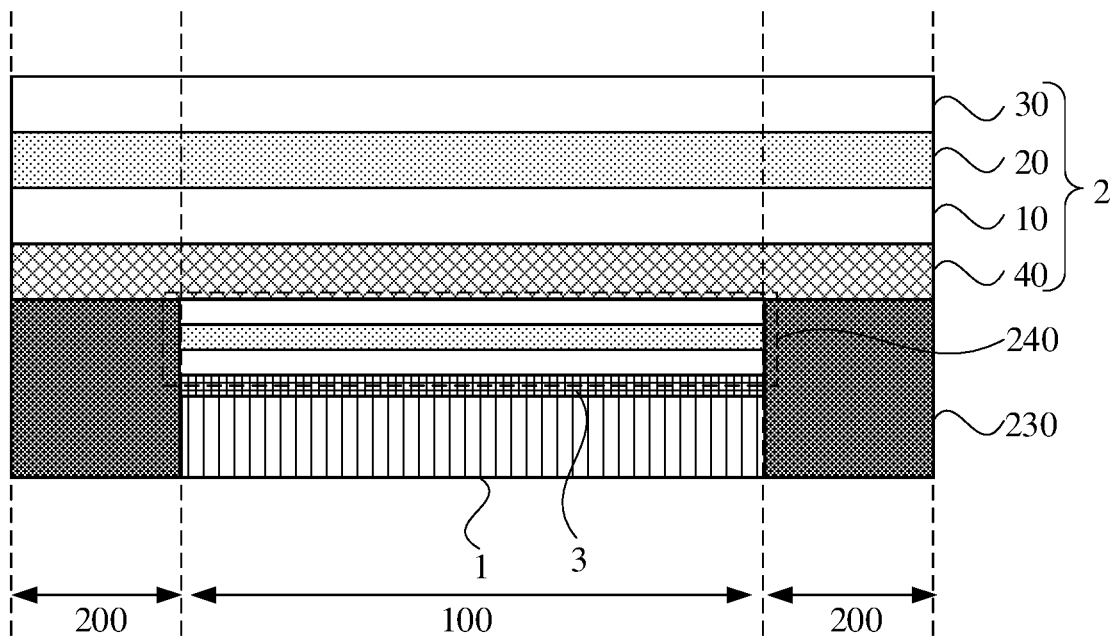
FIG. 26 is another cross-sectional view taken along the section line EE' of FIG. 24.

FIG. 26 is another cross-sectional view taken along the section line EE' of FIG. 24. Referring to FIG. 24 and FIG. 26, in an embodiment, the display device includes the display region 100 and the non-display region 200 around the display region 100. The display device further includes a second ink layer 230 and a second composite membrane 240. The second ink layer 230 is disposed in the non-display region 200 and the second composite membrane 240 is disposed in the display region 100, the second ink layer 230 and the display module 1 are disposed on the same side of the composite membrane 2, and the second composite membrane 240 is disposed between the display module 1 and the composite membrane 2.

The second composite membrane 240 is disposed between the display module 1 and the composite membrane 2, such that the light reflection efficiency of the display module 1 can be adjusted, which achieves the uniformity of the black states of the display region 100 and the non-display region 200 when the display device is turned off.

It is to be noted that the above are merely preferred embodiments of the present disclosure and the technical principles used therein. It is to be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may further include additional equivalent embodiments without departing from the concepts of the present disclosure. The scope of the present disclosure is determined by the scope of the appended claims.

What is claimed is:

1. A display device, comprising:
a display module; and
a composite membrane disposed on a light emitting surface side of the display module; wherein the composite membrane comprises:
a first graded-refractive-index layer, a first dielectric layer and a second graded-refractive-index layer which are stacked in sequence; wherein the first graded-refractive-index layer comprises at least two first sub-layers, and the second graded-refractive-index layer comprises at least two second sub-layers;

in a direction from the first graded-refractive-index layer to the first dielectric layer, refractive indexes of first sub-layers in the first graded-refractive-index layer sequentially increase, and refractive indexes of second sub-layers in the second graded-refractive-index layer sequentially decrease;
a refractive index of a first sub-layer adjacent to the first dielectric layer is less than or equal to a refractive index of the first dielectric layer; and
a refractive index of a second sub-layer adjacent to the first dielectric layer is less than or equal to the refractive index of the first dielectric layer;
wherein the device further comprises: a touchpad, wherein the touchpad and the composite membrane are stacked on the light emitting surface side of the display module in sequence.

2. The display device of claim 1, wherein
the composite membrane is attached to the light emitting surface side of the display module through an optical adhesive.

3. The display device of claim 2, wherein the composite membrane comprises a first substrate, the first substrate is disposed at a side of the first graded-refractive-index layer of the composite membrane facing away from the first dielectric layer, and the first substrate is attached to the light emitting surface side of the display module through the optical adhesive.

4. The display device of claim 3, wherein a refractive index of the first substrate is less than or equal to a refractive index of a first sub-layer adjacent to the first substrate.

5. The display device of claim 2, wherein the first dielectric layer comprises at least one transparent conductive layer, and the first dielectric layer constitutes a touch electrode layer.

6. The display device of claim 5, wherein the composite membrane further comprises a second substrate;
wherein the second substrate is disposed on a side of the first graded-refractive-index layer facing away from the first dielectric layer, and the second substrate is attached to the light emitting surface side of the display module through an optical adhesive; or
the second substrate is disposed on a side of the second graded-refractive-index layer facing away from the first dielectric layer, a surface of a side of the second substrate facing away from the second graded-refractive-index layer is a light emitting surface of the display module, and the composite membrane is disposed in the display module.

7. The display device of claim 1, wherein the touchpad is attached to the light emitting surface of the display module.

8. The display device of claim 1, further comprising:
a display region and a non-display region around the display region; and
a first ink layer and a first composite membrane, wherein both the first ink layer and the first composite membrane are disposed in the non-display region; and
wherein the first ink layer and the display module are disposed on a same side of the composite membrane, and the first composite membrane is disposed between the first ink layer and the composite membrane.

9. The display device of claim 1, further comprising:
a display region and a non-display region around the display region; and
a second ink layer and a second composite membrane, wherein the second ink layer is disposed in the non-display region and the second composite membrane is disposed in the display region; and wherein the second ink layer and the display module are disposed on a same side of the composite membrane, and the second composite membrane is disposed between the display module and the composite membrane.

10. The display device of claim 1, wherein both the first graded-refractive-index layer and the second graded-refractive-index layer comprise silicon oxynitride; and in the direction from the first graded-refractive-index layer to the first dielectric layer, a mass proportion of nitrogen element gradually increases and a mass proportion of oxygen element gradually decreases in the first graded-refractive-index layer, and a mass proportion of nitrogen element gradually decreases and a mass proportion of oxygen element gradually increases in the second graded-refractive-index layer.

11. The display device of claim 1, wherein a number of first sub-layers is the same as a number of second sub-layers, and a first sub-layer and a second sub-layer at symmetric positions relative to the first dielectric layer have a same refractive index.

12. The display device of claim 1, wherein the first dielectric layer comprises any one of niobium pentoxide, titanium dioxide, silicon nitride, indium tin oxide, fluorine-doped tin oxide, aluminum-doped zinc oxide, boron-doped zinc oxide or gallium-doped zinc oxide.

13. The display device of claim 1, wherein the first dielectric layer comprises a first transparent conductive layer;

wherein the first transparent conductive layer comprises a plurality of first touch electrodes arranged in a matrix and a plurality of second touch electrodes arranged in a matrix, adjacent first touch electrodes in a same matrix row are electrically connected to each other through a first connection component, adjacent second touch electrodes in a same matrix column are electrically connected to each other through a second connection component, and the first connection component and the plurality of first touch electrodes are disposed on a same layer; and wherein the first dielectric layer further comprises a first insulating layer, and the first insulating layer is disposed between a plane where the second connection component is located and a plane where the plurality of second touch electrodes is located.

14. The display device of claim 1 wherein the composite membrane further comprises: a second dielectric layer disposed on a side of the second graded-refractive-index layer facing away from the first dielectric layer, wherein a refractive index of the second dielectric layer is less than or equal to a refractive index of a second sub-layer adjacent to the second dielectric layer.

15. The display device of claim 14, wherein the second dielectric layer comprises magnesium fluoride, a fluorine-containing methacrylate copolymer, a copolymer of vinylidene fluoride and tetrafluoroethylene, a copolymer of fluorine-containing monofunctional methacrylate, or a copolymer of fluorine-containing difunctional methacrylate and polyfunctional methacrylate.

16. A display device, comprising:
a display module; and
a composite membrane disposed on a light emitting surface side of the display module; wherein the composite membrane comprises:
a first graded-refractive-index layer, a first dielectric layer and a second graded-refractive-index layer which are stacked in sequence; wherein the first graded-refractive-index layer comprises at least two first sub-layers, and the second graded-refractive-index layer comprises at least two second sub-layers;
in a direction from the first graded-refractive-index layer to the first dielectric layer, refractive indexes of first sub-layers in the first graded-refractive-index layer sequentially increase, and refractive indexes of second sub-layers in the second graded-refractive-index layer sequentially decrease;
a refractive index of a first sub-layer adjacent to the first dielectric layer is less than or equal to a refractive index of the first dielectric layer; and
a refractive index of a second sub-layer adjacent to the first dielectric layer is less than or equal to the refractive index of the first dielectric layer;
wherein the device further comprising:
a display region and a non-display region around the display region; and
a second ink layer and a second composite membrane, wherein the second ink layer is disposed in the non-display region and the second composite membrane is disposed in the display region; and
wherein the second ink layer and the display module are disposed on a same side of the composite membrane, and the second composite membrane is disposed between the display module and the composite membrane.

17. The display device of claim 16, wherein
the composite membrane is attached to the light emitting surface side of the display module through an optical adhesive.

18. The display device of claim 17, wherein the composite membrane comprises a first substrate, the first substrate is disposed at a side of the first graded-refractive-index layer of the composite membrane facing away from the first dielectric layer, and the first substrate is attached to the light emitting surface side of the display module through the optical adhesive.

19. The display device of claim 17, wherein the first dielectric layer comprises at least one transparent conductive layer, and the first dielectric layer constitutes a touch electrode layer.

20. The display device of claim 16, wherein the device further comprising: a touchpad, wherein the touchpad and the composite membrane are stacked on the light emitting surface side of the display module in sequence.

* * * * *